(12) United States Patent  (10) Patent No.: US 8,658,889 B2
Huang (45) Date of Patent: Feb. 25, 2014

(54) QUANTUM DOT THIN FILM SOLAR CELL

(75) Inventor: Kun-Ping Huang, Miaoli County (TW)

(73) Assignee: Industrial Technology Research Institute, Hsinchu (TW)

( * ) Notice: Subject to any disclaimer, the term of this patent is extended or adjusted under 35 U.S.C. 154(b) by 312 days.

(21) Appl. No.: 12/781,795

(22) Filed: May 17, 2010

(65) Prior Publication Data

US 2010/0288345 A1 Nov. 18, 2010

(30) Foreign Application Priority Data

May 18, 2009 (TW) .............................. 98116416 A
Apr. 13, 2010 (TW) .............................. 99111449 A (51) Int. Cl.
*H01L 31/00* (2006.01)
(52) U.S. Cl.
USPC ......................................... 136/264; 136/265
(58) Field of Classification Search
USPC .................................................. 136/243–265
See application file for complete search history.

(56) References Cited

U.S. PATENT DOCUMENTS

| 7,442,320 | B2 * | 10/2008 | Lee ........................... 252/62.3 E |
| 2004/0131792 | A1 * | 7/2004 | Bhattacharya ................. 427/437 |
| 2007/0209700 | A1 | 9/2007 | Yonezawa et al. |
| 2007/0272297 | A1 * | 11/2007 | Krivoshlykov et al. ....... 136/256 |
| 2008/0230120 | A1 | 9/2008 | Reddy |
| 2009/0095349 | A1 | 4/2009 | Forrest et al. |
| 2009/0233398 | A1 * | 9/2009 | Fox et al. ......................... 438/95 |
| 2010/0051092 | A1 * | 3/2010 | Dumitru et al. ............... 136/255 |

FOREIGN PATENT DOCUMENTS

| CN | 101432889 A | 5/2009 |
| TW | M319521 | 9/2007 |
| TW | 200810136 | 2/2008 |
| TW | 200826168 | 6/2008 |
| TW | 200826309 | 6/2008 |
| TW | 200834940 | 8/2008 |
| WO | WO 2007098378 A1 * | 8/2007 |

OTHER PUBLICATIONS

R. N. Bhattacharya, W. Batchelor, J. F. Hiltner, and J. R. Sites, "Thin-film CuIN1–xGaxSe2 photovoltaic cells from solution-based precursor layers", Applied Physics Letters 75 p. 1431 (1999).*
A.J. Nozik, Quantum dot solar cells, Physica E 14 (2002) 115-120.
Nasu et al., Semiconducting CdTe Microcrystalline-Doped SiO2 Glass Thin Films Prepared by Rf-Sputtering, Japanese Journal of Applied Physics vol. 28, No. 5, May 1989, p. L862-p. L864.
"Second Office Action of China Counterpart Application", issued on Dec. 19, 2012, p. 1-p. 7.

(Continued)

*Primary Examiner* — Jeffrey T Barton
*Assistant Examiner* — Eric R Smith
(74) *Attorney, Agent, or Firm* — Jianq Chyun IP Office (57) ABSTRACT

A quantum dot thin film solar cell is provided, which at least includes a first electrode layer, an optical active layer, and a second electrode layer sequentially deposited on a substrate. A plurality of quantum dots is formed in the optical active layer. Since the plurality of quantum dots and the optical active layer are formed through co-sputtering, an interface adhesion between the plurality of quantum dots and the optical active layer is good in this quantum dot thin film solar cell.

3 Claims, 5 Drawing Sheets

(56) References Cited

OTHER PUBLICATIONS

Bhattacharya et al., "Thin-film CuIn–xGaxSe2 photovoltaic cells from solution-based precursor layers," Applied Physics Letters, Sep. 6, 1999, pp. 1431-1432, vol. 75.

"Office Action of Taiwan Counterpart Application", issued on Jul. 8, 2013, p. 1-p. 14.
"First Office Action of China counterpart application" issued on Apr. 5, 2012, p1-p7.

* cited by examiner

QUANTUM DOT THIN FILM SOLAR CELL

CROSS-REFERENCE TO RELATED APPLICATION

This application claims the priority benefits of Taiwan application serial no. 98116416, filed on May 18, 2009 and Taiwan application serial no. 99111449, filed on Apr. 13, 2010. The entirety of each of the above-mentioned patent applications is hereby incorporated by reference herein and made a part of this specification.

BACKGROUND

1. Field of the Disclosure

The present disclosure relates to a quantum dot thin film solar cell.

2. Description of Related Art

Solar cell is a very promising clean energy, which can directly produce electricity from sunlight. If a quantum dot effect is applied to the solar cell, an energy conversion rate thereof can be greatly improved. The so-called quantum dot effect generally relates to the following two effects.

One effect is an impact ionization (II) effect. In semiconductor material, when energy of two bandgaps is provided from external, excited electrons may exist in form of hot electrons. When the hot electrons are transited form high energy level to low energy level excitation state, the released energy can excite another electron from a valence band to a conduction band, and such phenomenon is referred to as the impact ionization effect. According to such effect, one high-energy photon can excite two or a plurality of hot electrons.

Another effect is an Auger recombination (AR) effect relative to the impact ionization effect, which refers to that in the semiconductor material, the energy released due to recombination of hot electron and hole can excite another hot electron to transit to a higher energy level, so as to prolong a lifetime of the hot electron in the conduction band.

When the semiconductor material displays a quantum dot size, the continuous conduction band is gradually split into small energy levels, so that a cooling speed of the electrons is slowed down, and therefore the impact ionization effect and the Auger recombination effect can be effectively utilized. According to theoretical calculations, the traditional single junction solar cell only can achieve 31% energy conversion efficiency, and if combining with the ionization and Auger recombination effects, the maximum theoretical efficiency of the solar cell can be 66%, which definitely shows a potential of using the quantum dots in the solar cell.

In a present dye-sensitized solar cell (DSSC), nano quantum dots are added into the solar cell. However, an energy conversion rate of the solar cell is low due to a poor interface adhesion between nano-crystals and an optical active layer, which is even worse than a situation without adding the quantum dots.

Although U.S. Patent Publication No. 20080230120 and Taiwan Patent Publication No. 200810136 all provide a nano photovoltaic device with quantum efficiency, a nano-crystal layer thereof is independent, so that regarding a whole structure thereof, a transparent conductive film or a tunnel junction is added, which may increase a fabrication cost.

SUMMARY

The disclosure is directed to a quantum dot thin film solar cell, which has an optical active layer containing quantum dots.

The disclosure provides a quantum dot thin film solar cell, which at least includes a first electrode layer, an optical active layer, and a second electrode layer sequentially deposited on a substrate, wherein a plurality of quantum dots is formed in the optical active layer.

The disclosure further provides a quantum dot thin film solar cell, which at least includes a substrate, a P-type conductive layer disposed on the substrate, an optical active layer deposited on the P-type conductive layer, an N-type semiconductor layer deposited on the optical active layer, and an N-type conductive layer disposed on the N-type semiconductor layer, wherein a plurality of quantum dots is formed in the optical active layer.

The disclosure further provides a quantum dot thin film solar cell, which at least includes a substrate, a first electrode layer disposed on the substrate, a P-i-N silicon thin film layer deposited on the first electrode layer, and a second electrode layer disposed on the P-i-N silicon thin film layer, wherein a plurality of quantum dots is formed in an intrinsic layer of the P-i-N silicon thin film layer.

In the disclosure, a bandgap of the quantum dots is selected from one or more than one of an infrared (IR) range, a visible light range and an ultraviolet (UV) range. If the bandgap of the quantum dots is in the IR range, a material of the quantum dots is one or a plurality of substances selected from a substance group consisting of PbS, GaSb, InSb, InAs and CIS, etc. If the bandgap of the quantum dots is in the visible light range, the material of the quantum dots is one or a plurality of substances selected from a substance group consisting of InP and CdS, etc. If the bandgap of the quantum dots is in the UV range, the material of the quantum dots is one or a plurality of substances selected from a substance group consisting of $TiO_2$, $ZnO$ and $SnO_2$, etc.

According to the above descriptions, since the structure of the disclosure can be fabricated by physical vapor deposition (PVD) such as vacuum coating equipment, co-sputtering, etc., the interface adhesion between the quantum dots and the optical active layer in the quantum dot thin film solar cell can be improved, so that an impact ionization effect and an Auger recombination effect can be effectively utilized. Moreover, the optical active layer and the quantum dots thereof in the quantum dot thin film solar cell of the disclosure can be formed in a same fabrication process, so that a photoelectric conversion rate of the quantum dot thin film solar cell of the disclosure is certainly better than a conventional quantum dot dye-sensitized solar cell (QDSSC).

In order to make the aforementioned and other features and advantages of the present disclosure comprehensible, several exemplary embodiments accompanied with figures are described in detail below.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DETAILED DESCRIPTION OF DISCLOSED EMBODIMENTS

Embodiments are provided below with reference of drawings to fully describe the technique of the present disclosure. However, the disclosure can still be implemented by different approaches, and is not limited to the provided embodiments. The provided embodiments are used for providing a detailed and thorough description of the disclosure, so as to fully convey the spirit of the disclosure to those skilled in the art. For clarity, sizes and relative sizes of layers and regions in the drawings are not scaled.

In the disclosure, the description of one device or layer "is located on another device or layer" may contain the situations that the one device or layer is directly located on the other device or layer, or one or more additional devices or layers are between the one device or layer and the other device or layer. Moreover, although the terms "first" and "second", etc. are used for describing various devices an/or layers, it should be known that such terms are not used for limiting the devices and/or layers. Such terms are only used for distinguishing one device or layer from another device or layer. Therefore, a first layer can be regarded as a second layer without departing from the spirit and scope of the disclosure.

Moreover, the spatial relative terms, such as "on", "under", etc., are used for describing a relationship between one device or characteristic and another device or characteristic. For example, if a device in the figure is turned over, the device or characteristic described to be located "on" the other device or characteristic is now oriented to be located "under" the other device or characteristic.

Figure 1:
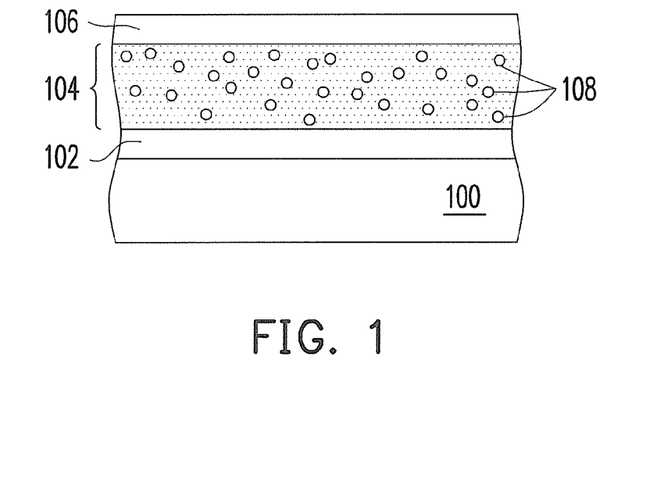
FIG. 1 is a structural cross-sectional view of a quantum dot thin film solar cell according to an exemplary embodiment of the disclosure.

FIG. 1 is a structural cross-sectional view of a quantum dot thin film solar cell according to an exemplary embodiment of the disclosure. Referring to FIG. 1, the quantum dot thin film solar cell of the disclosure at least includes a first electrode layer 102, an optical active layer 104, and a second electrode layer 106 sequentially deposited on a substrate 100, wherein a plurality of quantum dots 108 is formed in the optical active layer 104. Since the optical active layer 104 can be formed according to a physical vapor deposition (PVD) process, an atom layer deposition (ALD) process, a molecular beam epitaxy (MBE) process, or a metal organic chemical vapor deposition (MOCVD) process, etc., while the optical active layer 104 is fabricated, the quantum dots 108 can be simultaneously formed therein, so that an interface problem between the quantum dots and the optical active layer of a conventional quantum dot dye-sensitized solar cell (QDSSC) can be totally resolved, and therefore the impact ionization effect and the Auger recombination effect can be effectively utilized. The quantum dots 108 and the optical active layer 104 of the disclosure are formed in the same fabrication process, so that an energy conversion rate thereof is certainly better.

Figure 2:
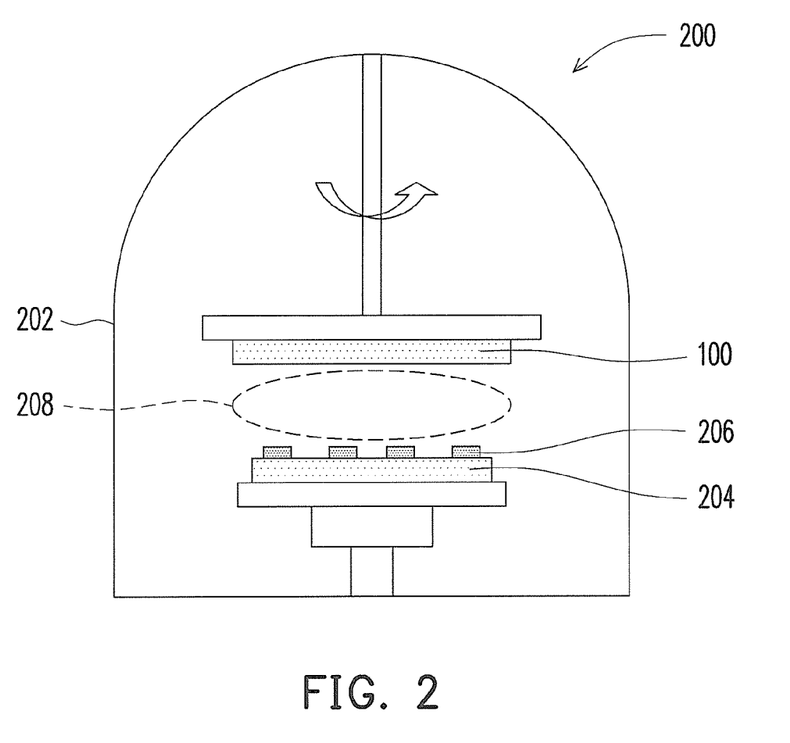
FIG. 2 is a schematic diagram illustrating a vacuum coating equipment used for forming an optical active film of the disclosure.

A vacuum coating equipment 200 shown in FIG. 2 is used to perform target-attached sputtering to form the optical active layer 104. In FIG. 2, a processing chamber 202 and a target 204 are illustrated, and a substrate 100 is disposed opposite to the target 204 (in which the first electrode layer 102 is not illustrated). When the vacuum coating equipment 200 is powered, plasma 208 is generated between the target 204 and the substrate 100. A plurality of pellets 206 is disposed on the target 204, wherein a material of the target 204 corresponds to a material of the optical active layer, and a material of the pellet 206 corresponds to a material of the quantum dots. Therefore, during the sputtering process, the target 204 can form a matrix of film (i.e. the optical active layer), and the pellets 206 can form nano depositions within the film, which can serve as the quantum dots of the thin film solar cell. Moreover, sizes and density of the quantum dots can be controlled by adjusting a distribution of the pellets 206 on the target 204, an RF power or a working pressure.

In FIG. 1, the optical active layer 104 is an extensive technical term, which may refer to amorphous silicon (a-Si), microcrystalline silicon (μc-Si), copper indium gallium diselenide (CIGS), copper indium diselenide (CIS), copper gallium diselenide (CGS), copper gallium ditelluride (CGT), copper indium aluminium diselenide (CIAS), II-VI or III-V semiconductor, etc. A bandgap of the quantum dots 108 can cover an infrared (IR) range, a visible light range and an ultraviolet (UV) range. Namely, various types of quantum dot materials can be simultaneously used to increase a photon absorption range. For example, if the bandgap of the quantum dots 108 is in the IR range, the material of the quantum dots 108 is one or a plurality of substances selected from a substance group consisting of PbS, GaSb, InSb, InAs and CIS, etc. If the bandgap of the quantum dots 108 is in the visible light range, the material of the quantum dots 108 is one or a plurality of substances selected from a substance group consisting of InP and CdS, etc. If the bandgap of the quantum dots 108 is in the UV range, the material of the quantum dots 108 is one or a plurality of substances selected from a substance group consisting of $TiO_2$, ZnO and $SnO_2$, etc. The feasibility of conducting the conduction band in energy level is a consideration for selecting the materials of the quantum dots 108 and the optical active layer 104.

Several exemplary embodiments of applying the concept of the disclosure to different thin film solar cells are provided below, and the materials of the quantum dots and the optical active layer can be appropriately selected according to the above description.

First Exemplary Embodiment

Figure 3:
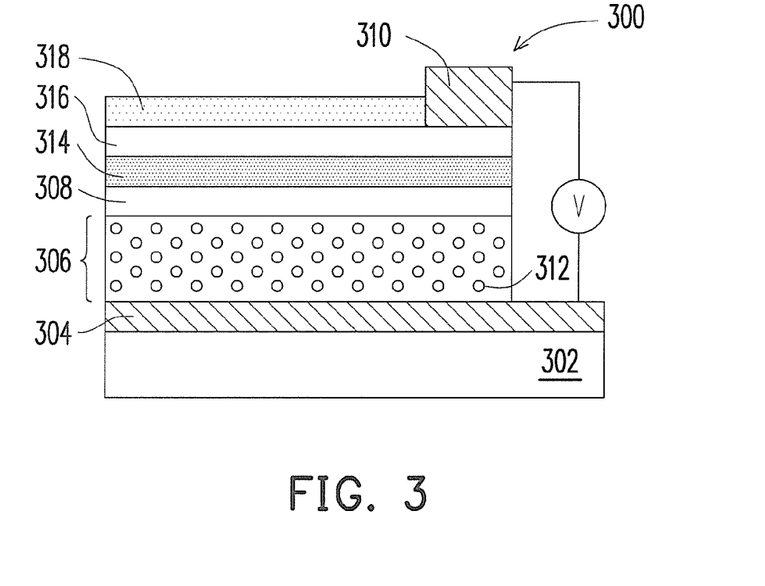
FIG. 3 is a structural cross-sectional view of a quantum dot thin film solar cell according to a first exemplary embodiment of the disclosure.

FIG. 3 is a structural cross-sectional view of a quantum dot thin film solar cell according to the first exemplary embodiment of the disclosure.

Referring to FIG. 3, the quantum dot thin film solar cell 300 of the first exemplary embodiment includes a substrate 302, a P-type conductive layer 304, an optical active layer 306, an N-type semiconductor layer 308, and an N-type conductive layer 310, wherein a plurality of quantum dots 312 is formed in the optical active layer 306. Although the quantum dots 312 present an even distribution state in FIG. 3, the disclosure is not limited thereto. In other words, the quantum dots 312 formed in the optical active layer 306 can also present an irregular distribution state.

Referring to FIG. 3 again, a material of the optical active layer 306 of the first exemplary embodiment is, for example, a substance selected from a substance group consisting of CIGS, CIS, CGS, CGT, and CIAS. For example, if the material of the optical active layer 306 is CIGS, a material of the P-type conductive layer 304 can be molybdenum (Mo), a material of the N-type semiconductor layer 308 can be cadmium sulfide (CdS), and a material of the N-type conductive layer 310 can be nickel/aluminium (Ni/Al). Moreover, an inhibition layer 314 and a conductive layer 316 can be further formed between the N-type semiconductor layer 308 and the N-type conductive layer 310. An anti-reflection layer 318 may be formed on the conductive layer 316, if necessary. A material of the inhibition layer 314 is, for example, zinc oxide (ZnO), a material of the conductive layer 316 is, for example, aluminium doped zinc oxide (AZO), and a material of the anti-reflection layer 318 is, for example, magnesium fluoride ($MgF_2$).

Since the optical active layer 306 containing evenly distributed quantum dots 312 can be formed according to the target-attached sputtering method, if the conduction band in energy level is suitably controlled, the energy conversion rate can be improved. Sizes and density of the quantum dots can be controlled according to the aforementioned fabrication parameters.

Second Exemplary Embodiment

Figure 4:
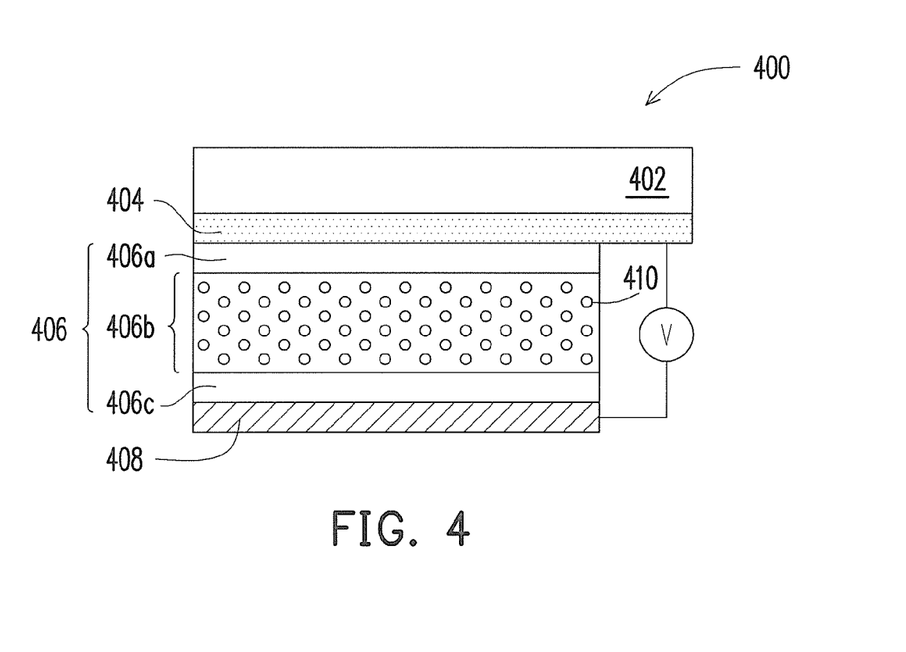
FIG. 4 is a structural cross-sectional view of a quantum dot thin film solar cell according to a second exemplary embodiment of the disclosure.

FIG. 4 is a structural cross-sectional view of a quantum dot thin film solar cell according to the second exemplary embodiment of the disclosure.

Referring to FIG. 4, the quantum dot thin film solar cell 400 of the second exemplary embodiment at least includes a substrate 402, a first electrode layer 404 disposed under the substrate 404, a P-i-N silicon thin film layer 406 deposited under the first electrode layer 404, and a second electrode layer 408 disposed under the P-i-N silicon thin film layer 406, wherein a plurality of quantum dots 410 is formed in an intrinsic layer 406b of the P-i-N silicon thin film layer 406. The P-i-N silicon thin film layer 406 is, for example, a structure formed by a-Si, μc-Si or microcrystalline silicon germanium (μc-SiGe). For example, the P-i-N silicon thin film layer 406 may include a P-type hydrogenated amorphous silicon (a-Si:H) layer 406a deposited on the first electrode layer 404, an a-Si:H intrinsic layer 406b deposited on the P-type a-Si:H layer 406a, and an N-type a-Si:H layer 406c deposited on the a-Si:H intrinsic layer 406b. In this case, a material of the first electrode layer 404 can be transparent conductive oxide (TCO), and a material of the second electrode layer 408 can be metal, such as aluminium or silver.

Third Exemplary Embodiment

Figure 5:
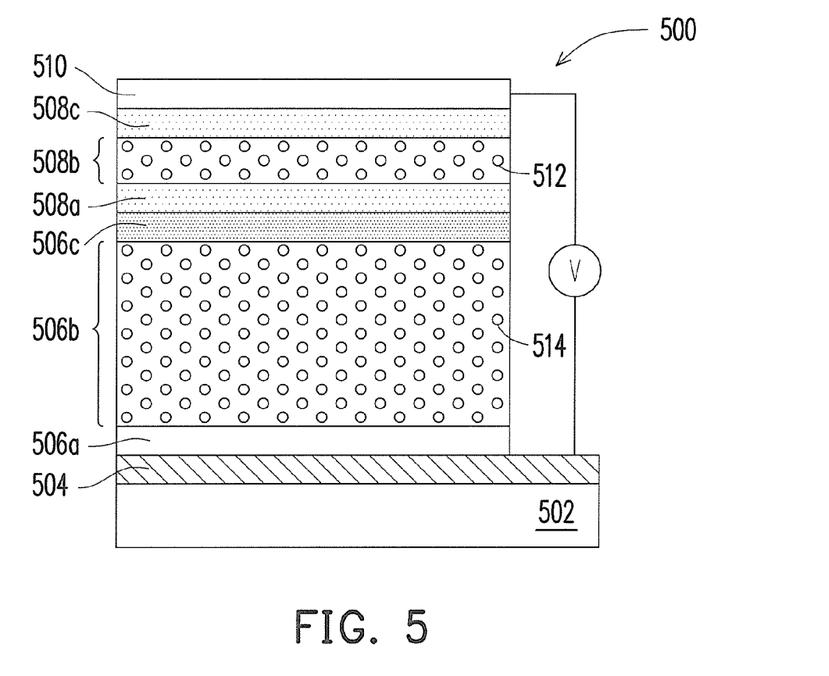
FIG. 5 is a structural cross-sectional view of a quantum dot thin film solar cell according to a third exemplary embodiment of the disclosure.

FIG. 5 is a structural cross-sectional view of a quantum dot thin film solar cell according to the third exemplary embodiment of the disclosure.

Referring to FIG. 5, the quantum dot thin film solar cell 500 of the third exemplary embodiment is a tandem solar cell, which at least includes a substrate 502, a first electrode layer 504 disposed on the substrate 502, a P-i-N hyhrogenated microcrystalline silicon (μc-Si:H) thin film formed by an N-type μc-Si:H layer 506a deposited on the first electrode layer 504, a μc-Si:H intrinsic layer 506b and a P-type μc-Si:H layer 506c, a P-i-N a-Si:H thin film foamed by an N-type a-Si:H layer 508a deposited on the P-type μc-Si:H layer 506c, an a-Si:H intrinsic layer 508b and a P-type a-Si:H layer 508c, and a second electrode layer 510 disposed on the P-type a-Si:H layer 508c. In the present exemplary embodiment, quantum dots 514 and 512 are respectively formed in the μc-Si:H intrinsic layer 506b and the a-Si:H intrinsic layer 508b, and materials of the quantum dots 512 and 514 can be those materials with bandgaps smaller than that of the μc-Si:H intrinsic layer 506b and the a-Si:H intrinsic layer 508b. In this case, a material of the first electrode layer 504 can be metal, and a material of the second electrode layer 510 can be TCO.

Fourth Exemplary Embodiment

Figure 6:
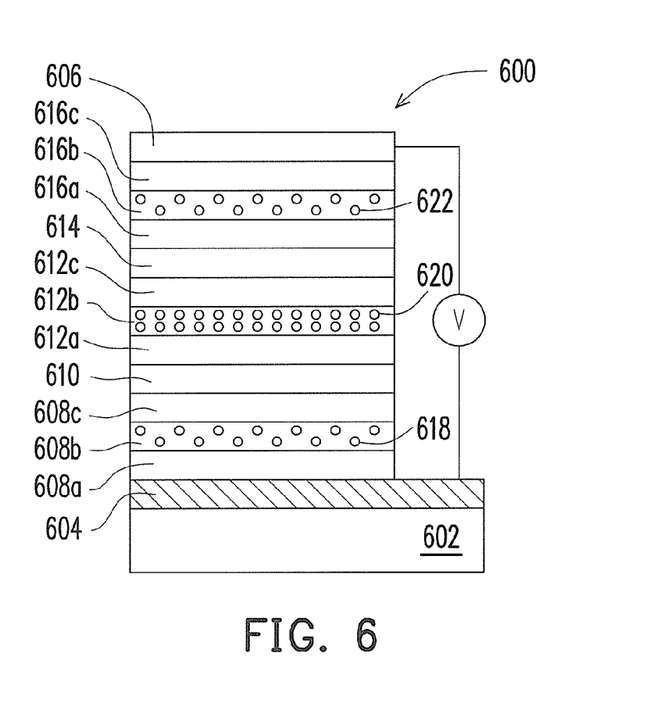
FIG. 6 is a structural cross-sectional view of a quantum dot thin film solar cell according to a fourth exemplary embodiment of the disclosure.

FIG. 6 is a structural cross-sectional view of a quantum dot thin film solar cell according to the fourth exemplary embodiment of the disclosure.

Referring to FIG. 6, the quantum dot thin film solar cell 600 of the fourth exemplary embodiment is a tandem solar cell, which at least includes a substrate 602 and a first electrode layer 604 and a second electrode layer 606 disposed on the substrate 602, and one layer of P-type III-V semiconductor layer, one layer of III-V semiconductor intrinsic layer and one layer of N-type III-V semiconductor layer can be deposited between the first and the second electrode layers 604 and 606. Wherein, a material of the P-type III-V semiconductor is, for example, gallium arsenide (GaAs), indium phosphide (InP) or gallium indium phosphide (GaInP), a material of the III-V semiconductor intrinsic layer is, for example, GaAs, InP or GaInP, and a material of the N-type III-V semiconductor layer is, for example, GaAs, InP or GaInP.

However, the solar cell of the fourth exemplary embodiment is a multi junction solar cell staking with multiple material layers. For example, one layer of P-type Ge layer 608a, one layer of Ge intrinsic layer 608b, one layer of N-type Ge layer 608c, one layer of first tunnel junction 610, one layer of P-type GeAs layer 612a, one layer of GaAs intrinsic layer 612b, one layer of N-type GaAs layer 612c, one layer of second tunnel junction 614, one layer of P-type GaInP layer 616a, one layer of GaInP intrinsic layer 616b, one layer of N-type GaInP layer 616c can be sequentially formed on the first electronde layer 604 to form a three junction cell of Ge, GaAs and GaInP, and since an absorption spectrum range thereof is very wide, the energy conversion rate thereof is rather high. Especially, quantum dots 618, 620 and 622 can be respectively formed in the Ge intrinsic layer 608b, the GaAs intrinsic layer 612b and the GaInP intrinsic layer 616b to mitigate the interface problem between the quantum dots and the layer where the quantum dots exist, so that the impact ionization effect and the Auger recombination effect can be effectively utilized. In the fourth exemplary embodiment, a material of the first electrode layer 604 is, for example, metal, and a material of the second electrode layer 606 is, for example, TCO.

Fifth Exemplary Embodiment

Figure 7:
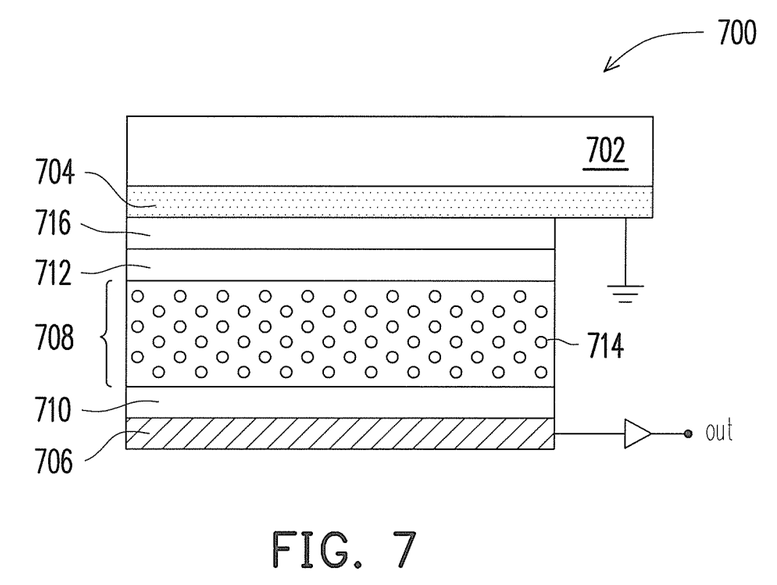
FIG. 7 is a structural cross-sectional view of a quantum dot thin film solar cell according to a fifth exemplary embodiment of the disclosure.

FIG. 7 is a structural cross-sectional view of a quantum dot thin film solar cell according to the fifth exemplary embodiment of the disclosure.

Referring to FIG. 7, the quantum dot thin film solar cell 700 of the fifth exemplary embodiment includes a substrate 702, an N-type conductive layer 704, a P-type conductive layer 706, a II-VI semiconductor intrinsic layer 708, a P-type semiconductor layer 710 and an N-type semiconductor layer 712, wherein a plurality of quantum dots 714 is formed in the II-VI semiconductor intrinsic layer 708. Although the quantum dots 714 present an even distribution state in FIG. 7, the disclosure is not limited thereto.

Referring to FIG. 7 again, in the present exemplary embodiment, if a material of the II-VI semiconductor intrinsic layer 708 is cadmium telluride (CdTe), a material of the P-type semiconductor layer 710 can be antimony telluride ($Sb_2Te_3$), a material of the N-type semiconductor layer 712 can be cadmium sulfide (CdS), a material of the P-type conductive layer 706 can be molybdenum (Mo), and a material of the N-type conductive layer 704 can be indium tin oxide (ITO). Moreover, an inhibition layer 716 can be further formed between the N-type semiconductor layer 712 and the N-type conductive layer 704, and a material thereof is, for example, ZnO.

Several experiments are provided below to verify an effect of the disclosure.

Experiment One

An a-Si thin film solar cell of FIG. 4 is fabricated, wherein the a-Si thin film solar cell contains PbS quantum dots. Another a-Si thin film solar cell without adding the PbS quantum dots is also fabricated for comparison.

Figure 8:
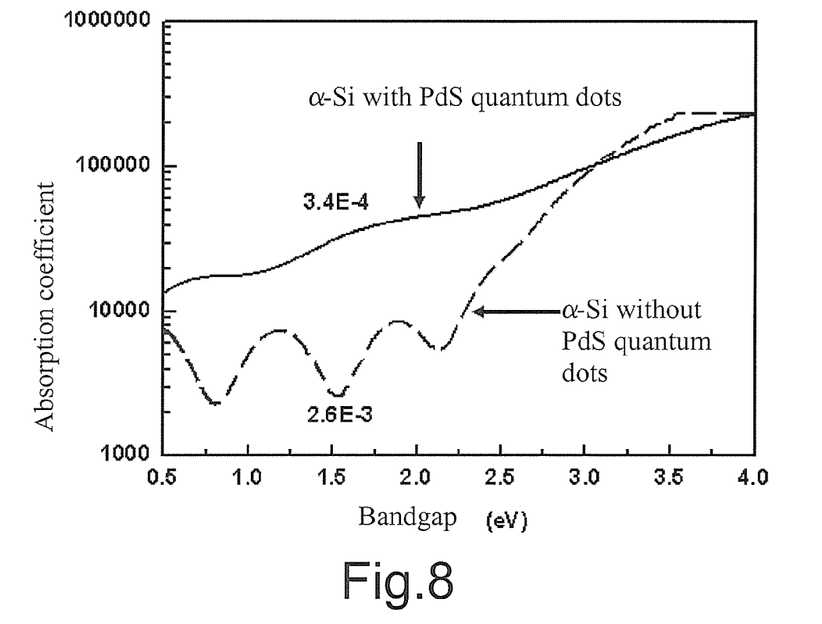
FIG. 8 is a curve diagram obtained by measuring an a-Si thin film solar cell according to an experiment one.

Then, optical absorption coefficients of the two a-Si thin film solar cells are measured to obtain FIG. 8.

According to FIG. 8, it is known that after the PbS quantum dots are added to the a-Si thin film solar cell, the optical absorption coefficient is obviously increased at a visible light part and an infrared (IR) part, and especially in the IR part, the optical absorption is increased by nearly thirteen times (from 2.6E3 increasing to 3.4E4).

Experiment Two

A CGS thin film solar cell of FIG. 4 is fabricated, wherein the CGS thin film solar cell contains CIS quantum dots. Another CGS thin film solar cell without adding the CIS quantum dots is also fabricated for comparison.

Figure 9:
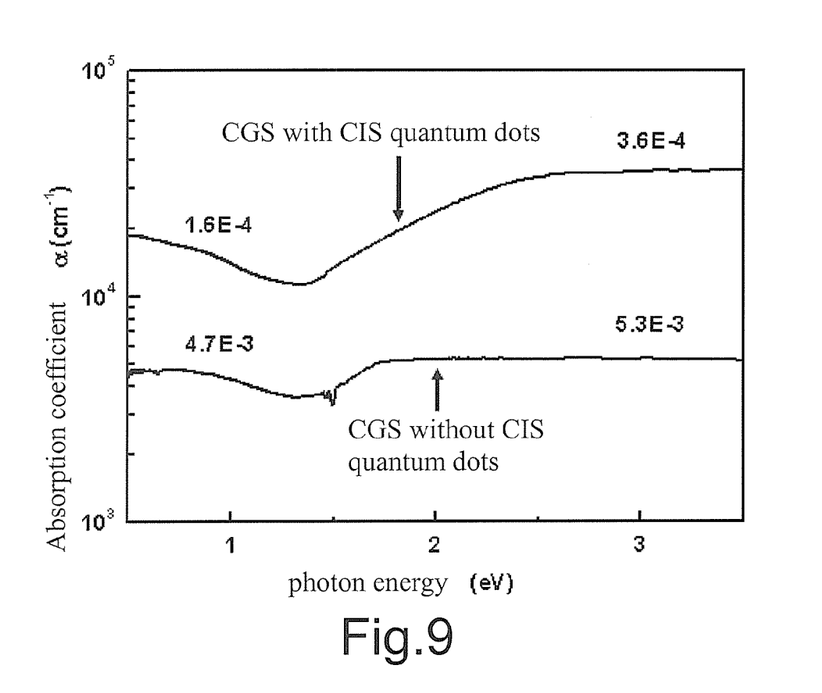
FIG. 9 is a curve diagram obtained by measuring a CGS thin film solar cell according to an experiment two.

Then, optical absorption coefficients of the two CGS thin film solar cells are measured to obtain FIG. 9.

According to FIG. 9, it is known that after the CIS quantum dots are added to the CGS thin film solar cell, the optical absorption coefficient is obviously increased at the visible light part and the IR part, and the optical absorption is increased by nearly seven times (from 5.3E3 increasing to 3.6E4).

In summary, in the structure of the disclosure, when the optical active layer of the thin film solar cell is deposited, the quantum dots are simultaneously formed in the optical active layer, so that the interface adhesion between the quantum dots and the optical active layer in the quantum dot thin film solar cell can be improved, and therefore the impact ionization effect and the Auger recombination effect can be effectively utilized. Moreover, since the optical active layer and the quantum dots thereof in the quantum dot thin film solar cell of the disclosure are formed in a same fabrication process, a photoelectric conversion rate of the quantum dot thin film solar cell of the disclosure is certainly better than a conventional quantum dot dye-sensitized solar cell (QDSSC).

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A quantum dot thin film solar cell, comprising:
   a substrate;
   a P-type conductive layer, disposed on the substrate;
   an optical active layer, deposited on the P-type conductive layer;
   an N-type semiconductor layer, deposited on the optical active layer; and
   an N-type conductive layer, disposed on the N-type semiconductor layer, wherein
   the optical active layer consists of a copper gallium diselenide (CGS) layer and a plurality of copper indium diselenide (CIS) quantum dots evenly distributed in the CGS layer.

2. The quantum dot thin film solar cell as claimed in claim 1, further comprising:
   a conductive layer, located between the N-type semiconductor layer and the N-type conductive layer;
   an inhibition layer, located between the N-type semiconductor layer and the conductive layer; and
   an anti-reflection layer, located on the conductive layer.

3. The quantum dot thin film solar cell as claimed in claim 2, wherein a material of the inhibition layer comprises zinc oxide (ZnO), a material of the conductive layer comprises aluminium doped zinc oxide (AZO), and a material of the anti-reflection layer comprises magnesium fluoride ($MgF_2$).

* * * * *